United States Patent [19]

Stevens et al.

[11] Patent Number: 5,632,873
[45] Date of Patent: May 27, 1997

[54] TWO PIECE ANTI-STICK CLAMP RING

[76] Inventors: Joseph J. Stevens, 5653 Enning Ave., San Jose, Calif. 95123; Roy J. Edwards, 215 Mont Clair Rd., Los Gatos, Calif. 95030; Avi Tepman, 21610 Rainbow Dr., Cupertino, Calif. 95014

[21] Appl. No.: 446,396

[22] Filed: May 22, 1995

[51] Int. Cl.⁶ .................... C23C 14/34; C23C 14/50; C23C 16/04; B05C 13/00
[52] U.S. Cl. ................ 204/298.15; 204/298.11; 204/298.23; 204/192.12; 118/720; 118/721; 118/729; 118/503; 118/504; 427/248.1
[58] Field of Search ............ 204/298.11, 298.15, 204/298.23, 298.25, 192.12; 118/720, 721, 728, 729, 503, 504; 269/21, 254 R, 288; 427/248.1

[56] References Cited

U.S. PATENT DOCUMENTS

| 4,978,412 | 12/1990 | Aoki et al. ............... 118/728 |
| 5,228,501 | 7/1993 | Tepman et al. ........... 118/728 |
| 5,316,278 | 5/1994 | Sherstinsky et al. ..... 269/254 R |
| 5,421,401 | 6/1995 | Sherstinsky et al. ..... 118/728 |

FOREIGN PATENT DOCUMENTS

50181A2  10/1994  European Pat. Off. .
0650181  4/1995  European Pat. Off. .

*Primary Examiner*—R. Bruce Breneman
*Assistant Examiner*—Rodney G. McDonald
*Attorney, Agent, or Firm*—Patterson & Streets

[57] ABSTRACT

A chamber for depositing a film layer on a substrate includes a support member on which the substrate is positioned for processing in the chamber, and a ring assembly suspended in the chamber on a chamber shield. The ring assembly comprises first and second rings, the second ring being disposed intermediate the first ring and the substrate. The support member is positionable in the chamber to receive a substrate thereon, and further positionable to pass the substrate through the shield and thereby lift the ring assembly off the shield. After deposition is complete, the support member retracts through the shield, to reposition the outer ring on the shield. The inner ring continues to move downwardly with the substrate support member a short distance before it is repositioned on the shield. In the event that a deposition material layer has formed between the substrate and the outer ring, the inner ring includes a plurality of tabs thereon which contact the substrate to force it out of the ring assembly as the inner ring continues downwardly after the outer ring has been positioned on the shield.

43 Claims, 11 Drawing Sheets

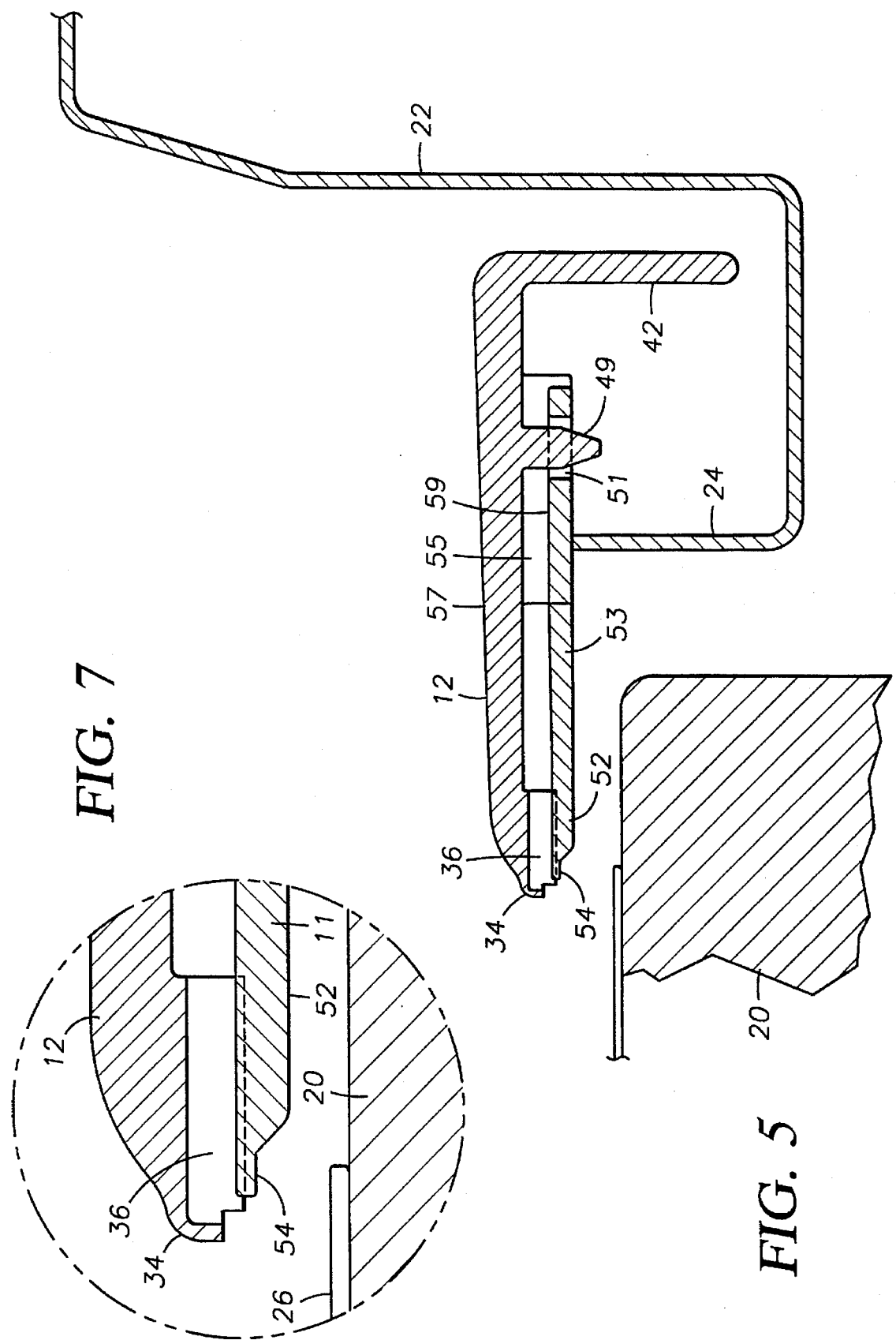

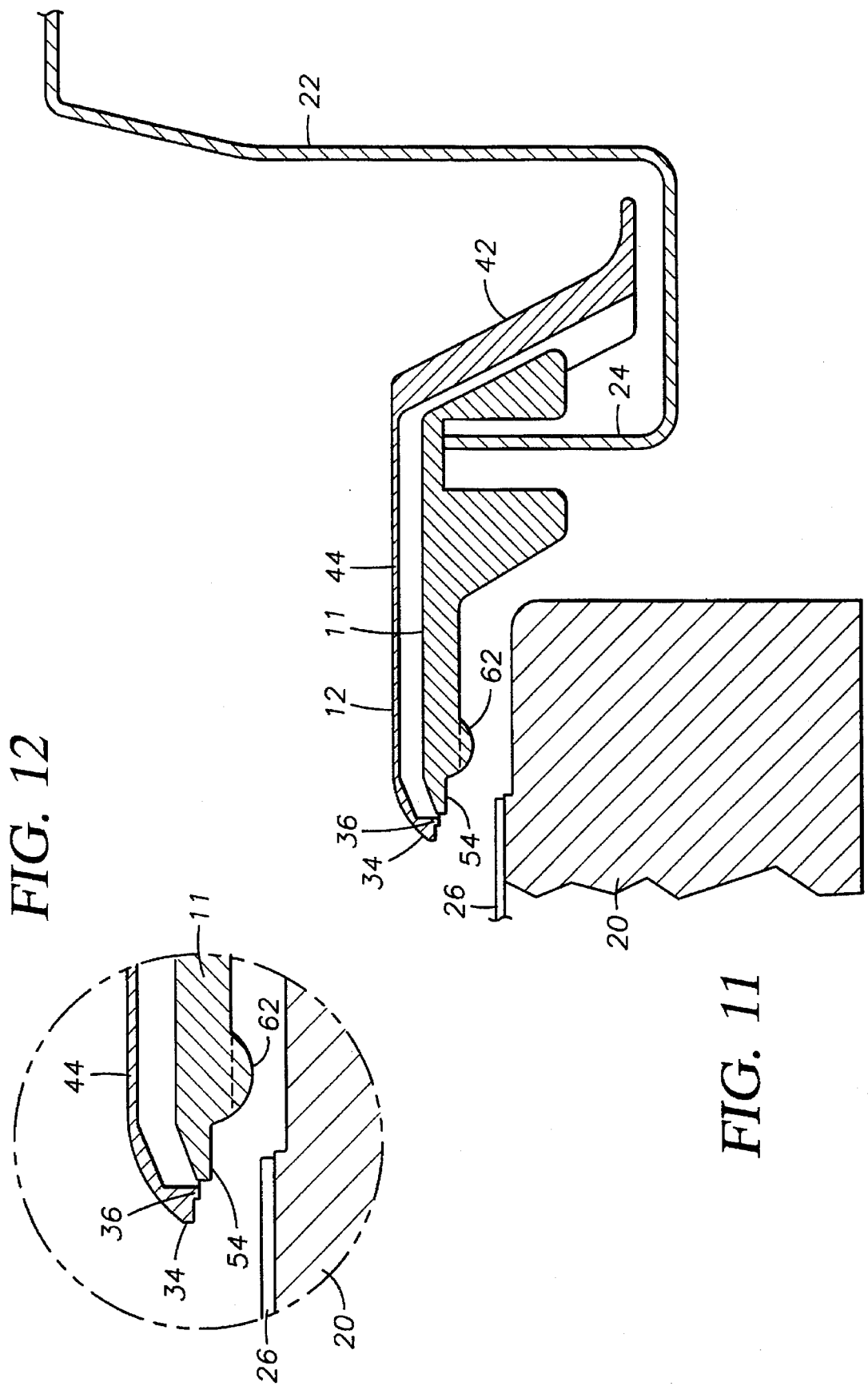

TWO PIECE ANTI-STICK CLAMP RING

BACKGROUND OF THE INVENTION

1. Field of the Invention

The present invention relates to semiconductor substrate processing equipment. More particularly, the present invention relates to methods and apparatuses wherein a substrate is clamped to a support member with a clamp ring, and the deposition layer may form a bridging deposit between the clamp ring and the substrate surface. More particularly still, the present invention provides methods and apparatuses for detaching a substrate from a ring when the deposition material forms a bridging film layer between the substrate and an adjacent chamber component such as a clamp ring, without causing significant damage to the substrate. Further, the present invention provides methods and apparatuses for detaching a substrate having minimal moving parts which slide, rub or engage each other near the substrate surface.

2. Background of the Art

The fabrication of semiconductor devices on substrates, including semiconductor substrates, typically requires the deposition of multiple metal, dielectric and semiconductor film layers on the surface of the substrate. The film layers are typically deposited on the substrates in vacuum chambers. One deposition process is sputtering, wherein a target comprised of the deposition material is exposed to a plasma and atoms or larger particles of target material are sputtered from the target and are deposited on the substrate. An additional example of a deposition process is chemical vapor deposition, wherein a chemical vapor is exposed to the substrate and a film layer of the vapor components may be formed on the substrate.

To support the substrate in the chamber, a support member, commonly a susceptor or a pedestal, is located in the chamber. The substrate is placed on, and secured to, the upper surface of the support member during the deposition process.

To form the deposition layer on the substrate, a deposition environment must be created within the chamber adjacent to the deposition receiving surface of the substrate. In a chemical vapor deposition chamber, the deposition environment is a chemical vapor which, when contacted with the substrate, deposits onto the substrate to form the deposition layer. In a physical vapor deposition system, the deposition environment includes a plasma maintained between a target and the deposition receiving surface of the substrate and a flux of sputtered target particles passing between the target and the deposition receiving surface of the substrate. A portion of the sputtered target particles deposit on the substrate to create the deposition layer.

In both the chemical vapor deposition and physical vapor deposition systems, the deposition material will, if left unconfined, deposit on all of the interior surfaces of the chamber. Therefore, shield arrangements have been devised to restrict the deposition environment to a region adjacent to the deposition receiving surface of the substrate. The shield system typically includes a fixed wall portion which extends between the chamber cover and the position within the chamber where the pedestal is positioned during the deposition of the film. The fixed wall portion extends around the circumference of the support member when the support member is positioned for the deposition, and it thus blocks access of the deposition environment to the walls and interior components of the chamber. However, a small gap must be provided between the support member and the shield, to allow the support member to retract and extend in the chamber without the risk of the support member contacting the fixed wall portion.

The gap between the inner terminus of the fixed wall portion and the support member provides a path for deposition material to enter the regions of the chamber which are protected by the fixed wall portion and deposit an undesirable film layer on these surfaces. Therefore the gap is covered, typically by placing an annular ring over the gap. The ring is commonly known as a clamp ring, because it can also serve as the means for securing the substrate to the support member. To enable heat transfer between the support member and the substrate, the substrate must be firmly chucked to the support member. One means of chucking is to physically "clamp" the substrate to the support member by virtue of the weight of the clamp ring. The clamp ring typically includes a lip, which extends inwardly of the support member and over the edge of a substrate received on the support member. The lip is sized to extend inwardly over the substrate by a distance which is sufficient to block access of the deposition material to the substrate edge below the lip and from the juncture of the clamp ring with the support member, and is further sized to provide a small space between the underside of the lip and the upper surface of the substrate. Without the lip, deposition material could form a bridging layer between the edge of the substrate and the support member which could interfere with the easy removal of the substrate from the support member.

Although the clamp ring with the overhanging lip prevents the formation of a film layer between the substrate and the pedestal, deposition material may still deposit on the inner edge and underside of the lip and eventually bridge the space between the upper surface of the substrate and the lip. This bridging film layer may be strong enough to attach the substrate to the clamp ring, in which case the chamber must be shut down to remove the substrate and the entire substrate will be rendered worthless. In the worst case, the substrate may maintain an attachment to the clamp ring for only a short period of time, after which it falls in the chamber. In that case, the chamber components might also be damaged. To prevent this, the clamp ring must be periodically replaced with a clean clamp ring on a regular maintenance schedule. However, on occasion a bridging deposition material layer may still form between the substrate and the lip.

In co-pending application Ser. No. 08/358,161, a clamp ring is described for shielding a substrate during film layer deposition. This ring includes a biasing member to separate the substrate from the clamp ring if a bridging film layer has formed between the clamp ring and the substrate during processing. One potential limitation of this design may be the location of moving parts above the substrate, which might create particles above the surface of the substrate which could then fall onto, and contaminate a substrate. Additionally, if anti-stick mechanisms have tangential movement to free the substrate from the ring, such as where the rocker arm pushes a substrate from the ring, the mechanism may move along the surface of the substrate a short distance, thereby "scratching" the substrate and generating particles. Finally, if the clamp ring is provided with a member to physically push the substrate therefrom, a hood must typically be provided to receive the member, and the hood may physically block line of sight access between the substrate and portions of the target, thereby shadowing the substrate. Although this design provides a significant improvement over clamp rings where no means is provided to ensure separation of the substrate from the clamp ring, there still exists a need for a clamp (or shield) arrangement that will provide shielding of the substrate edge while further eliminating, or substantially reducing, the risk of damage to the substrate resulting from substrate attachment to the clamp ring, and while reducing the likelihood of particle generation in the chamber. The present invention provides methods and apparatuses for solving substrate "sticking" problems and/or related particle concerns in physical vapor deposition (PVD) chambers or other film layer deposition chambers.

SUMMARY OF THE INVENTION

Our invention is an annular ring assembly for use in a chamber used to deposit a film layer on a substrate, in particular a semiconductor substrate. The ring generally includes a two piece ring system, comprising an outer ring and an inner ring. The two piece system detaches a substrate which has at least partially "bonded" to the support member about the substrate edge by using a separating force supplied by the weight of the inner ring. The separating force is generated due to the transfer of the inner ring's weight to the edge of the "bonded" substrate as the support member moves downwardly in the processing chamber to replace the rings on an internal ring support such as the upturned wall of a shield arrangement. In the event that a substrate is bonded to the outer ring at one location, the inner ring will be momentarily supported on the upper surface of the substrate and the upper surface of the substrate support. Therefore, the entire weight of the ring will not need to be transferred to the substrate to break this small bonded region. If the substrate is bonded to the outer ring at several different locations, the ring may be momentarily supported entirely on the substrate, thereby transferring all of the weight of the ring to the substrate to dislodge the substrate from the outer ring. In each instance, the maximum dislodging or separating force has an upper limit governed by the weight of the ring.

The outer ring preferably includes a base, which may be comprised of a plurality of spacer members, adapted to rest on the top surface of the substrate and thereby clamp the substrate to the support member, a roof extending outward of the base and generally parallel to the surface of the substrate, and an annular lip extending inward of the base and which overhangs an annular region near the perimeter of the substrate, thereby shielding the region of the substrate below the lip from the deposition environment. The outer ring is preferably positioned over the edge of the substrate during deposition, and is preferably positioned on a hanger (along with the inner ring), such as the inner terminus of the chamber shield arrangement, during the loading and unloading of the substrate from the chamber.

Uniquely, the ring assembly includes an inner ring which provides a force to push the substrate from the ring assembly in the event that a film layer has formed between the substrate and the outer ring. In the most preferred aspect of the invention, the inner ring is arranged so that it does not contact the wafer unless, and until, the wafer becomes "bonded" to the outer ring. Preferably, the inner ring includes a plurality of inwardly extending tabs which extend over, but are spaced from, the upper surface of the substrate and which do not hinder deposition layer formation. Additionally, the tabs only contact the substrate when the ring assembly is replaced on the hanger and then only in the event that the substrate has become bonded to the outer ring. Further, the inner ring does not touch or engage the outer ring, except at minimal defined alignment points located radially outwardly of the substrate edge, which reduces the possibility of particle generating contact of parts above the surface of the substrate.

In another aspect of the invention, the separating force is assisted by external biasing members such as springs, mounted beneath the roof of the outer ring, which are compressed when the outer ring rests on the substrate, and which provide a force to separate the ring assembly from the substrate when the substrate support is lowered after completion of the deposition of a film layer on the substrate. Each spring is oriented so that, in its non-compressed state, its longitudinal axis is at a slight angle relative to the plane of the substrate, and so that, when compressed by the weight of the outer ring resting on the substrate, the spring deflects to a reduced angle relative to the plane of the substrate.

The spring constants of the springs are selected so that the total separating force they can provide between the outer ring and the inner ring is less than the mass of the outer ring, but is preferably large enough to overcome the adhesive strength of any thin deposition layer that may be present between the substrate and the lip.

In operation, the ring assembly is initially positioned on a hanger, such as the chamber shield, surrounding the periphery of the support member. As the support member moves upwardly in the chamber, the inner ring contacts the edge of the support member. On continued ascension of the support member, the outer ring contacts either the edge of the substrate or the edge of the support member outwardly of the edge of the substrate positioned thereon and is lifted off the hanger. Where the base contacts the support member, the inner ring is recessed into a slot formed in the base portion to enable the base portion to contact the support member without initially contacting the inner ring. Movement of the support member upwardly in the chamber moves the ring assembly sufficiently upward, with respect to the shield, so as to first lift the inner ring off the shield and subsequently to lift the outer ring off the shield. Thus, once the ring assembly is positioned on the substrate or the support member and the substrate is positioned for processing of the substrate, the inner ring is disposed below the outer ring, but does not contact the edge of the substrate or the outer ring. After processing, the support member moves downwardly in the chamber to reposition the ring assembly on the shield, and to position the substrate for removal from the chamber. As the support member moves from the processing position, the outer ring is first positioned on the shield. The inner ring continues to descend with the support member a short distance before being positioned on the hanger. This short distance is sufficient to allow the portion of the inner ring which may contact the substrate, preferably the tabs, to descend past the surface of the lip which over hangs the substrate during processing, and, if the substrate has become bonded to the lip, contact the substrate and provide a force to separate the substrate from the outer ring.

BRIEF DESCRIPTION OF THE DRAWINGS

FIG. 5 is a partial sectional view of one relationship of the ring assembly, substrate and support member immediately before the outer or inner rings are received on the substrate or immediately after the outer and inner rings are re-positioned onto the shield;

FIG. 6 is an enlarged view of the positioning of the outer ring on the substrate;

FIG. 7 is an enlarged view of the of the relationship of the ring assembly, substrate and support member immediately before the outer ring is received on the substrate or immediately after the outer and inner rings are re-positioned onto the shield;

FIG. 11 is a partial sectional view of an alternative embodiment of the present invention depicting one relationship of the ring assembly, substrate and support member immediately before the outer ring is received on the substrate or immediately after the outer ring is lifted off the substrate;

FIG. 12 is an enlarged view of an alternative embodiment of the present invention depicting the relationship of the clamp ring assembly, substrate and support member immediately before the clamp ring assembly is received on the substrate or immediately after the clamp ring assembly is re-positioned onto the shield;

DESCRIPTION OF THE PREFERRED EMBODIMENT

The substrate shield and ring assembly of the present invention prevents material being deposited on a semiconductor substrate from being deposited on the periphery of a substrate and on the adjacent surface of the substrate support member, while facilitating separation of the ring assembly from the substrate even when the material deposited on the substrate has bridged the gap between the substrate and the ring assembly. The invention is useful for any type of deposition chamber for semiconductor fabrication, such as a physical vapor deposition (PVD) chamber or a chemical vapor deposition (CVD) chamber for depositing a conductor, semiconductor or dielectric film on a substrate. Additionally, although the specific ring embodiment described herein is a clamp ring, it may be used in conjunction with cover rings of other substrate edge shielding arrangements.

The invention will be described below in a preferred implementation within a conventional PVD chamber for depositing a metal film on a semiconductor substrate. Before describing the unique features of the invention, the conventional components of the chamber are described.

Conventional Deposition Chamber Components

Figure 1:
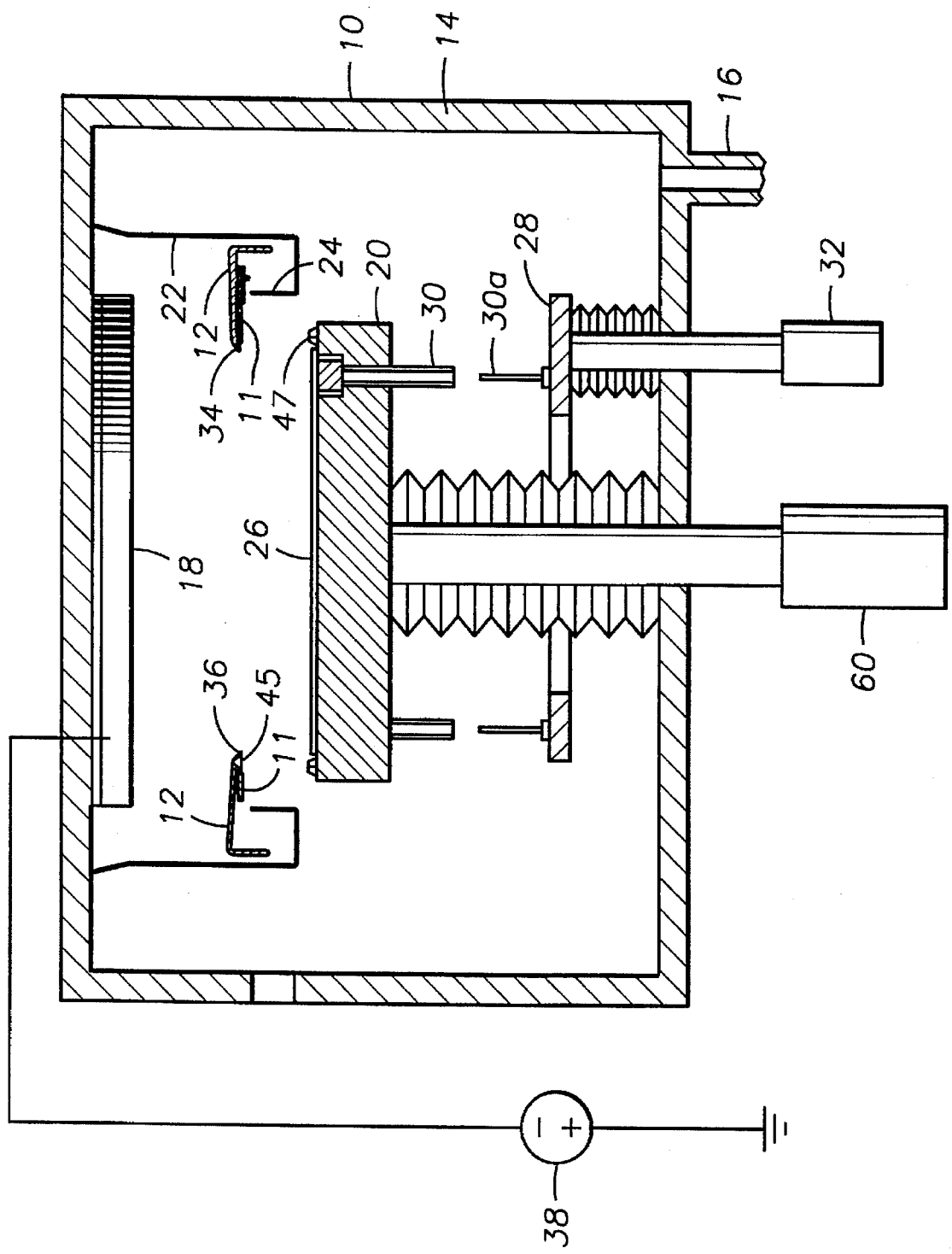
FIG. 1 is a sectional view of a deposition chamber showing the arrangement of the ring assembly and the support member in a deposition chamber wherein the support member is positioned below the ring assembly and shield.

FIG. 1 is a simplified sectional view of a conventional sputtering chamber 10 including the ring assembly of the present invention. The chamber 10 generally includes a chamber enclosure wall 14, having at least one gas inlet (not shown) and an exhaust outlet 16 connected to an exhaust pump (not shown). A substrate support pedestal 20 is disposed at the lower end of the chamber 10, and a target 18 is received at the upper end of the chamber 10. The target 18 is electrically isolated from the enclosure wall 14 and the enclosure wall 14 is preferably grounded, so that a negative voltage may be maintained on the target 18 with respect to the grounded enclosure wall 14. A shield 22 is suspended from the chamber cover, and this shield includes an annular, upturned, wall 24 on which the ring assembly may be suspended over the support member 20 when the support member 20 is retracted downwardly in the chamber 10 as shown in FIG. 1.

In preparation for receiving a new semiconductor wafer or substrate 26 into the chamber 10, the support member 20 is lowered by a drive mechanism well below the ring assembly suspended on the shield 22, and so that the bottom of the support member 20 is close to a pin positioning platform 28. The support member 20 includes three or more vertical bores (not shown), each of which contains a vertically slidable cap 30. When the support member 20 is in the lowered position Just described, the bottom tip of each cap 30 rests on the pin 30a (which attaches to the platform 28), and the upper tip of each cap 30 protrudes above the upper surface of the support member 20. The upper tip defines a plane parallel to the upper surface of the support member 20.

A conventional robot arm carries a semiconductor substrate 26 into the chamber 10 and places the substrate 26 above the upper tips of the caps 30 and pins 30a. A wafer lift mechanism 32 moves the pins 30a and caps 30 upwardly, to place the upper tips of the caps 30 against the underside of the substrate 26 and additionally lift the substrate 26 off the robot blade. The robot blade then retracts from the chamber 10, and the support lift mechanism 60 raises the support member 20 so that the support member 20 picks up the substrate 26 off the wafer lift pins 30. At this time, the caps will be resting in the platform's counter-bores.

The lift mechanism 60 continues to raise the support 20 so that the periphery of the substrate 26 contacts the inner portion of the annular clamp ring resting on the upturned wall portion 24. The inner diameter of the clamp ring is slightly smaller than the diameter of the substrate 26. As the support member 20 continues moving upward, the substrate 26 (supported by the support member 20) supports the entire weight of the clamp ring and lifts it above the upturned wall portion 24. At this point, the positions of the described components are as shown in FIG. 1.

Figure 2:
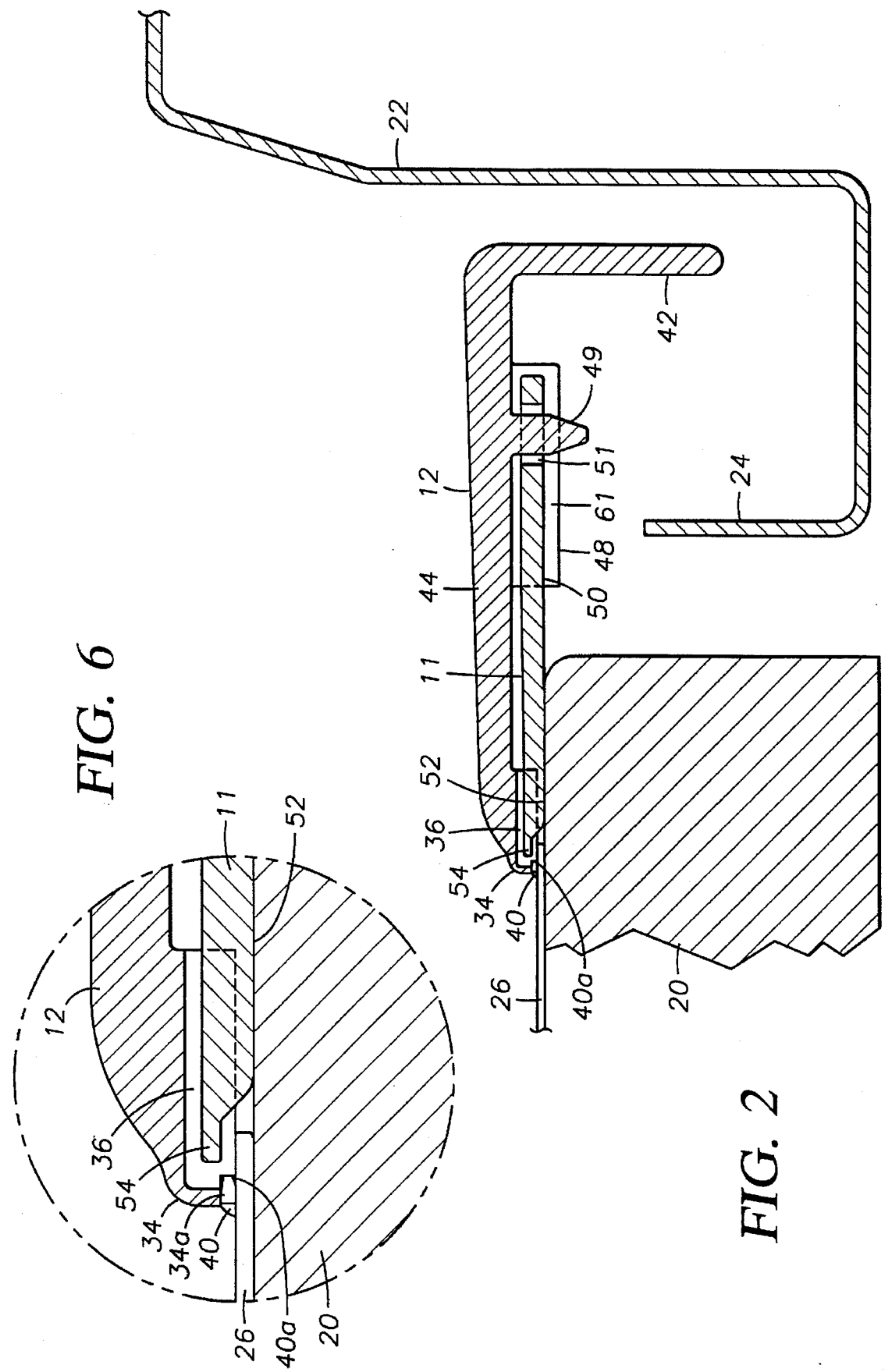
FIG. 2 is a partial sectional view of the interface of the ring assembly, the support member and the substrate with the outer ring received on the substrate.

As shown in FIGS. 2 and 7, the clamp ring includes an overhanging lip 34 (in the invention, the lip 34 is provided on an outer ring 12) which overhangs, but does not touch, the substrate 26 so as to shield the perimeter of the substrate 26 immediately below the lip 34 from receiving material being deposited on the substrate 26, and a plurality of spacers 36 extending downwardly from the lip 34, inwardly of the inner terminus of the lip 34, to space the lip 34 and the remainder of the clamp ring from the substrate 26 and the support member 20. The spacers 36 form the base of the clamp ring which rests on the upper surface of the substrate 26. The individual spacers 36 may be replaced with a continuous downwardly extending web to form a continuous base, if desired. The clamp ring should be heavy enough to prevent the clamp ring or the substrate 26 from sliding across the surface of the support member 20 and to achieve a sufficient enough pressure on the back side of the wafer when gas is flowed through ports on the top of the support member or the backs of the wafer. In steady state, the pressure on the back side of the wafer is proportional to clamp ring weight divided by the surface area on which the pressure acts on the back side of the wafer. In either case, the base 36 provides transfer of the ring mass to the substrate 26 to clamp the substrate to the support member 20.

At this point, the film deposition process can begin. In the case of the exemplary sputtering chamber 10 shown in FIG. 1, a sputtering process gas (typically argon) is supplied to the chamber through the gas inlet (not shown), and a DC power supply 38 applies a negative voltage to the sputtering target 18. The voltage excites the argon gas to a plasma state, and argon ions bombard the negatively biased target 18 to sputter material off the target 18. The sputtered material then deposits on the substrate 26, except for the periphery thereof which is shielded by the clamp ring.

After the film layer has been deposited on the substrate 26, the substrate 26 is removed from the chamber 10 by reversing the sequence of steps by which it was carried into the chamber 10. Specifically, the lift mechanism 60 lowers the support member 20 below the upturned wall portion 24, so that the clamp ring descends onto the shield. At this point the weight of the clamp ring is supported by the shield 22, not by the substrate 26 and support member 20. Ideally, there should be no significant adhesion between the substrate 26 and the clamp ring, so that the substrate 26 simply will continue to rest on top of the support member 20 as the support member descends below the clamp ring resting on the shield 22.

However, there is nothing to prevent sputtered material from depositing on the lip 34 of the clamp ring, and deposited material will accumulate on the lip 34, or at the adjacent wafer overhang vertical surface 34a, as successive substrates are processed in the chamber. Eventually, the material may accumulate to the point that it touches the surface of the substrate 26 located below the lip 34, so as to form a layer 40 or 40a of material bridging the gap between the clamp ring and the substrate 26 as shown in FIG. 2. When this happens, the bridging material 40 and 40a can act as an adhesive attaching the substrate 26 to the clamp ring. The deposited material which may accumulate at the adjacent wafer overhang vertical surface 34a may increase to the point where the substrate 26 becomes bonded to the clamp ring 12. Consequently, when the support member 20 descends below the shield 22, the substrate 26 may stick to the clamp ring resting on the shield 22 rather than descending along with the support member 20.

If the substrate 26 sticks to the clamp ring only temporarily and then falls onto the support member 20, it is likely to be damaged by the impact with the support member 20. If the substrate 26 adheres more strongly to the clamp ring and does not fall off, then processing must be halted and the chamber 10 must be opened to manually remove the substrate 26. In either case, the substrate 26 becomes worthless. This is a particular problem in the case of metal deposition chambers, because metal conductors generally are the last layers to be deposited on a semiconductor substrate, after the substrate has becomes valuable because of the number of expensive fabrication steps previously performed on it.

The present invention provides a ring assembly which includes two rings, a first ring to achieve clamping of the substrate 26 and shielding of the substrate edge and a second ring to prevent sticking of the substrate 26 to the ring assembly. The ring assembly of the present invention is adapted to operate in cooperation with the above described conventional deposition chamber components. A novel feature of the present invention is that the rings are spaced to enable the second ring to be recessed below the first ring and to provide lost motion movement which prevents sticking of the substrate 26 to the ring assembly should the substrate 26 become adhered to the ring assembly. To accomplish this cooperation of the inner and outer rings, the support lift mechanism 60 raises the support member 20 so that the periphery of the support member first contacts the inner ring 11, and shortly thereafter the substrate 26 contacts the annular outer ring 12, both the inner and outer rings initially resting on the upturned wall portion 24. The inner diameter of the rings are slightly smaller than the diameter of the substrate 26. As the support member 20 continues moving upward, the substrate 26 (supported by the support member 20) supports the entire weight of the outer ring 12 and lifts it above the upturned wall portion 24.

Figure 14:
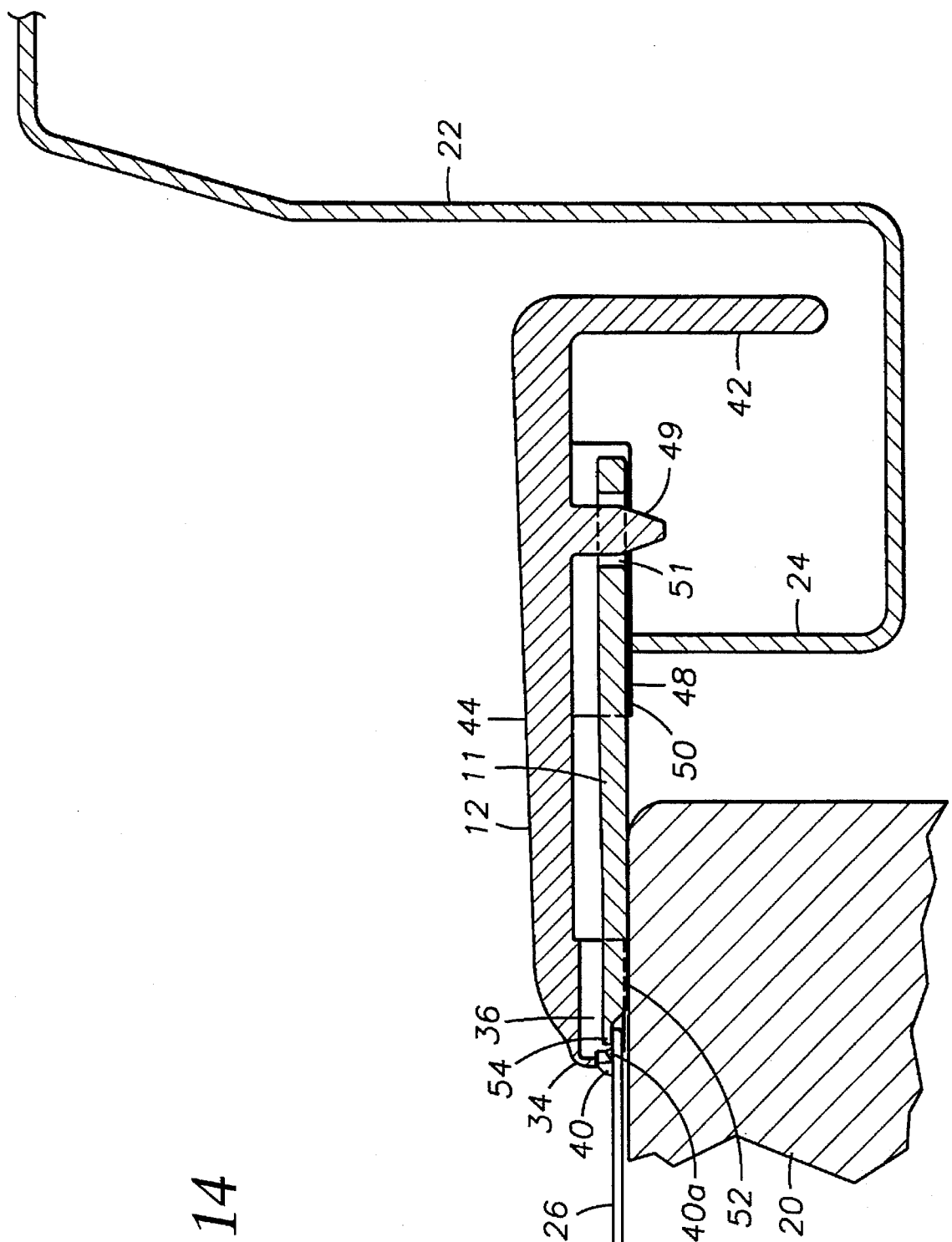
FIG. 14 is a partial sectional view depicting the relationship of the ring assembly, substrate and support member when a substrate has become bonded to the outer ring and the ejector tab of the inner ring contacts the upper surface of the substrate.

After the film layer has been deposited on the substrate 26, the substrate 26 is removed from the chamber 10 by reversing the sequence of steps by which it was carried into the chamber 10. Specifically, the lift mechanism 60 lowers the support member 20 below the upturned wall portion 24, so that the outer ring 12 descends onto the shield. At this point the weight of the outer ring 12 is supported by the shield 22, not by the substrate 26 and support member 20. The inner ring 11 continues to descend a short distance below the spacers 36 of the outer ring 12 before being positioned on the shield 22. This short distance is sufficient to allow the ejector tabs 54 of the inner ring 11 to contact a substrate 26 which has become adhered to the ring assembly. (shown in FIG. 14) Ideally, there should be no significant adhesion between the substrate 26 and the ring assembly, so that the substrate 26 simply will continue to rest on top of the support member 20 as the support member descends below the ring assembly resting on the shield 22 and the inner ring will not contact the substrate 26.

Novel Features of the Clamp Ring System

The ring assembly of the present invention prevents the substrate 26 from adhering to the ring assembly as the support member 20 descends below the upturned wall 24 of the shield 22, so that the substrate 26 will remain on the support member 20. The ring assembly of the present invention generally is a two ring system: a first ring provides the shielding of the substrate edge and any clamping of the substrate 26 to the support member 20; and a second ring forms the biasing member to break any bridging film layer 40 or 40a which may form between the first ring and the substrate 26.

In the preferred embodiment, the first ring is an outer ring 12 which provides the shielding of the substrate edge, and the clamping of the substrate 26 to the support member 20, and the second ring is an inner ring 11 which provides the force necessary to separate the substrate 26 from the outer ring 12 if a bridging film layer 40 or 40a is formed. Preferably, the inner ring 11 is received on the edge of the support member 20 during deposition and it includes an inwardly extending portion 54 which extends over, but does not touch the substrate 26 during deposition, but may contact the substrate 26 when a bridging film layer 40 or 40a forms between the substrate 26 and the outer ring 12. The outer ring 12 includes a downwardly projecting spacer 36 which is positioned on the substrate edge to clamp the substrate 26 to the support member 20. In addition, the outer ring 12 includes an overhanging lip 34 extending inward of the spacers 36 to shield the edge of the substrate 26, but the lip 34 does not contact the exposed surface of the substrate. In combination, the ring assembly provides a shield, clamp, and biasing member which facilitate substrate processing and removal, while minimizing damage suffered by substrates which adhere to the ring assembly.

Figure 15:
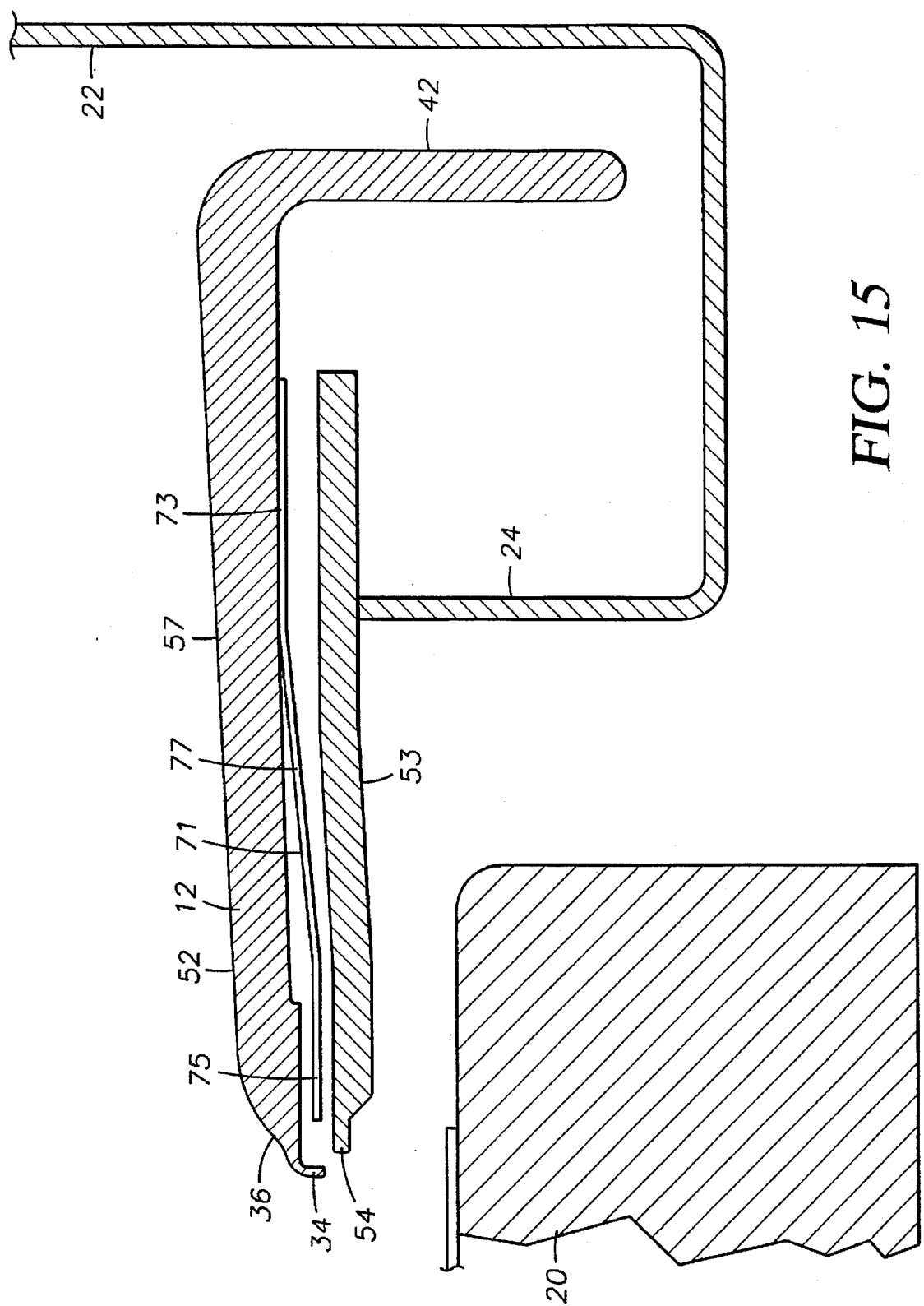
FIG. 15 is a partial sectional view depicting the relationship of the inner ring, the outer ring, and a biasing member (i.e., a spring) before the rings are lifted off the hanger or after the rings have been repositioned on the hanger.

In an alternative embodiment of the present invention, the separating force is assisted by external biasing members such as springs, mounted beneath the roof of the outer ring, which are compressed when the outer ring rests on the substrate, and which provide a force to separate the ring assembly from the substrate when the substrate support is lowered after completion of the deposition of a film layer on the substrate. (shown in FIG. 15) Each spring is oriented so that, in its non-compressed state, its longitudinal axis is at a slight angle relative to the plane of the substrate, and so that, when compressed by the weight of the outer ring between the inner and outer ring, the spring deflects to a reduced angle relative to the plane of the substrate.

The Outer Ring

As shown in FIG. 2, the preferred embodiment of the ring assembly includes an outer ring 12 having an annular, downward-extending, outer flange 42 from which an annular, horizontal roof 44 extends radially inward. The outer ring 12 preferably includes downwardly projecting spacers 36 which are positioned on the substrate edge to clamp the substrate 26 to the support member 20, or, a continuous, annular ring extending downwardly, and a lip extending inward of the spacer 36 to over hang the edge of a substrate 26. The spacers 36 and overhanging lip 34 are located at the inner circumference of the roof 44. A plurality of slots 46 extend between the downwardly extending spacers 36. The slots 46 define voids through which the ejector tabs 54 of the inner ring 11 extend to overhang the edge of the substrate 26. In addition, the spacers 36 define alignment recesses 45 which receive alignment pins 47 located around the outer periphery of the support member 20 to position the outer ring 12, and the inner ring 11, over the support member 20 and substrate 26 supported thereon. Although FIGS. 1 and 2 show only longitudinal sections of the ring assembly, all elements of the ring assembly have 3-fold circular symmetry relative to the longitudinal axis of the rings, so the 3-dimensional structure of the rings should be apparent from the Figures.

Figure 3:
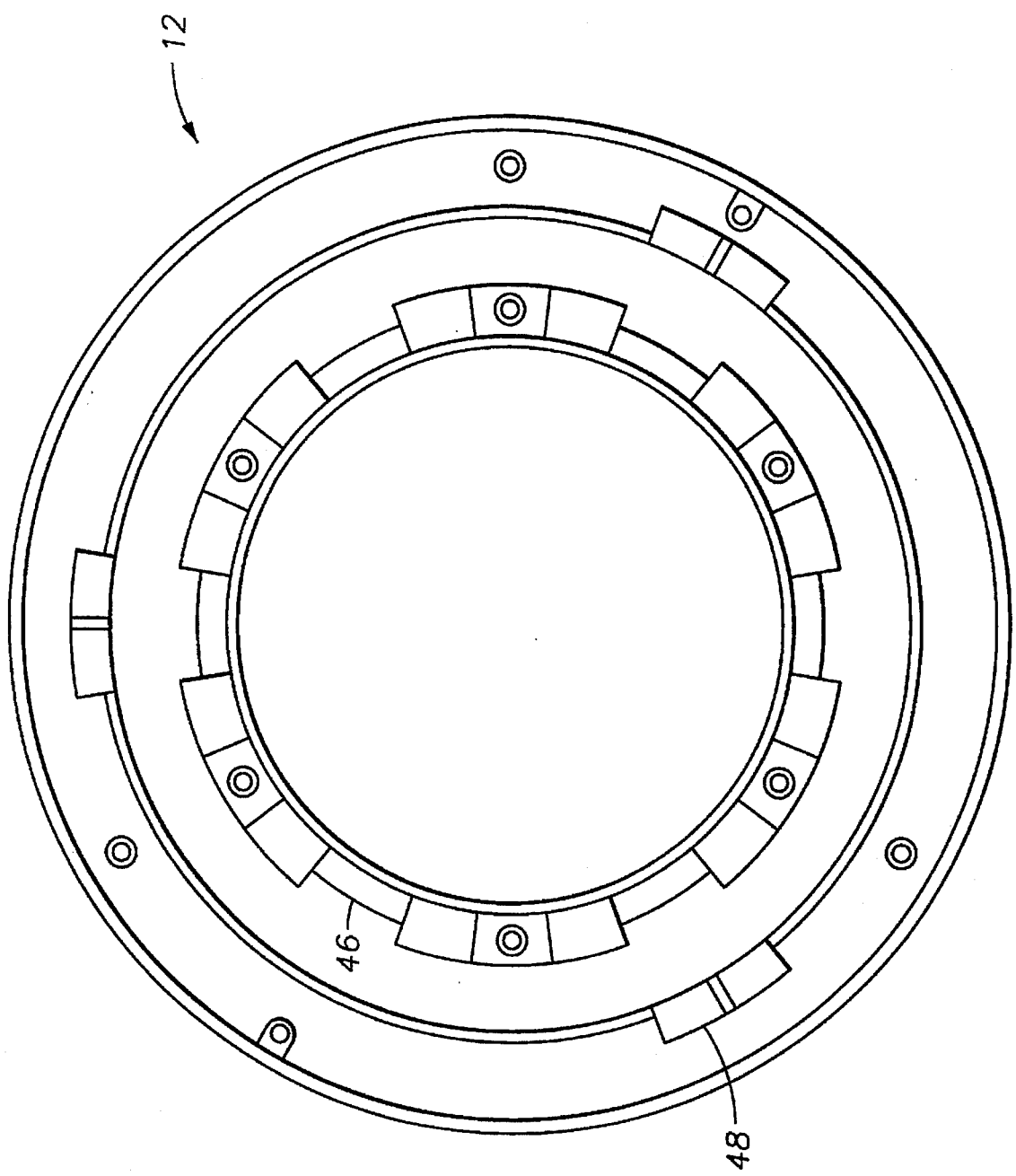
FIG. 3 is a bottom view of the outer ring shown in FIG. 2.

As shown in FIG. 3, the underside of roof 44 of the outer ring 12 preferably includes at least five slots 46 in the lip 36. In the preferred embodiment, six spacers 36 are provided on the underside of the outer ring 12, and the slots 46 extend radially between the spacers 36. Each slot 46 houses an ejector tab 54 of the inner ring 11 (shown in FIG. 4). The slots 46 are preferably equally spaced from each other circumferentially with a wafer flat defining a sixth slot in embodiments adapted for use with substrates having an alignment flat.

An outer base portion 48 is adapted to support the outer ring 12 on the shield 22 just prior to or following processing of the substrate 26. The outer base portion, preferably, includes a plurality of support tabs 48 which extend downwardly from the roof 44 to extend through the slots 56 defined in the outer annular base portion of the inner ring 11 to contact the shield member 22. The roof 44 includes a plurality of alignment pins 49 extending downwardly to cooperate with recesses 51 defined in the outer base portion 50 of the inner ring 11 to properly align the rings to each other.

The New, Inner Ring

The inner ring 11 includes an outer alignment or base portion 50 disposed below the underside of the roof 44 of the outer ring 12 (shown in FIG. 12) and adapted to be received on the shield 22, and an inner annular base portion 52 adapted to be received on the substrate support member 20 extending inwardly from the outer portion 50 and terminating in an ejector tab 54 which forms the inner terminus of the inner ring 11. The inner base portion 52 of the inner ring 11 can be positioned at an angle with respect to the lower surface of the roof 44, preferably at about a 0° to 5° angle as shown in FIG. 2 and FIG. 5. An intermediate annular portion 53 extends between the outer annular base portion 50 and the inner annular base portion 52 to provide a deflection angle. Importantly, this downward deflection angle must be great enough so that when the outer ring 12 contacts the upturned wall 24 of the shield 22, the inner portion of the ejector tabs 54 extends below the lower face of the spacers 36 to provide selective contacting of the substrate 26 to break any bond formed by a bridging layer 40 or 40a between the outer ring 12 and the substrate 20. The lower face of the ejector tabs 54 are spaced from the lower face of the inner base portion 52. This space is preferably greater than the thickness of the substrate 26 so that the inner ring 11 can be supported on the support member 20 and recessed under the outer ring 12 without having the ejector tabs 54 contact the substrate 26. The offset created by the deflection angle allows the inner ring 11 to be received on the support member 20, while the outer ring 12 is received on the substrate 26, thus enabling the inner ring 11 to descend below the lower face of the spacers 36 to contact a substrate 26 if it becomes bonded to the ring assembly. The offset ensures that the ejector tabs 54 of the inner ring 11 descend a sufficient distance below the spacers 36 of the outer ring 12 to achieve ejection of the substrate 26 should ejection become necessary.

In the preferred implementation, the inner ring 11 includes an inner circumferential surface which includes the circumferential substrate ejecting surface, preferably configured as a plurality of inwardly projecting, but stationary with respect to the inner ring, ejector tabs 54, which are shielded from the deposition environment by the outer ring 12, and which extend over, but do not touch, the edge of the substrate 26 when deposition is occurring. To support the tabs 54 in the proper position with respect to the surface of the substrate 26, the tabs extend inwardly from the inner base portion 52 and are spaced above the lower face of the inner base portion 52 which contacts the edge of the support member 20 when the ring assembly is lifted off the hanger 22 during film layer deposition. Preferably, this inner base portion 52 is planar, and forms an annular planar contacting surface which is received on the edge of the support member 20 just beyond the perimeter of the substrate 26. The planar surface transfers the weight of the inner ring 11 over a large area, to minimize any scratching or nicking of the support member 20. The tabs 54 extend over, but do not contact, the substrate 26 when the inner ring 11 is received on the support member 20 during processing.

Figure 4:
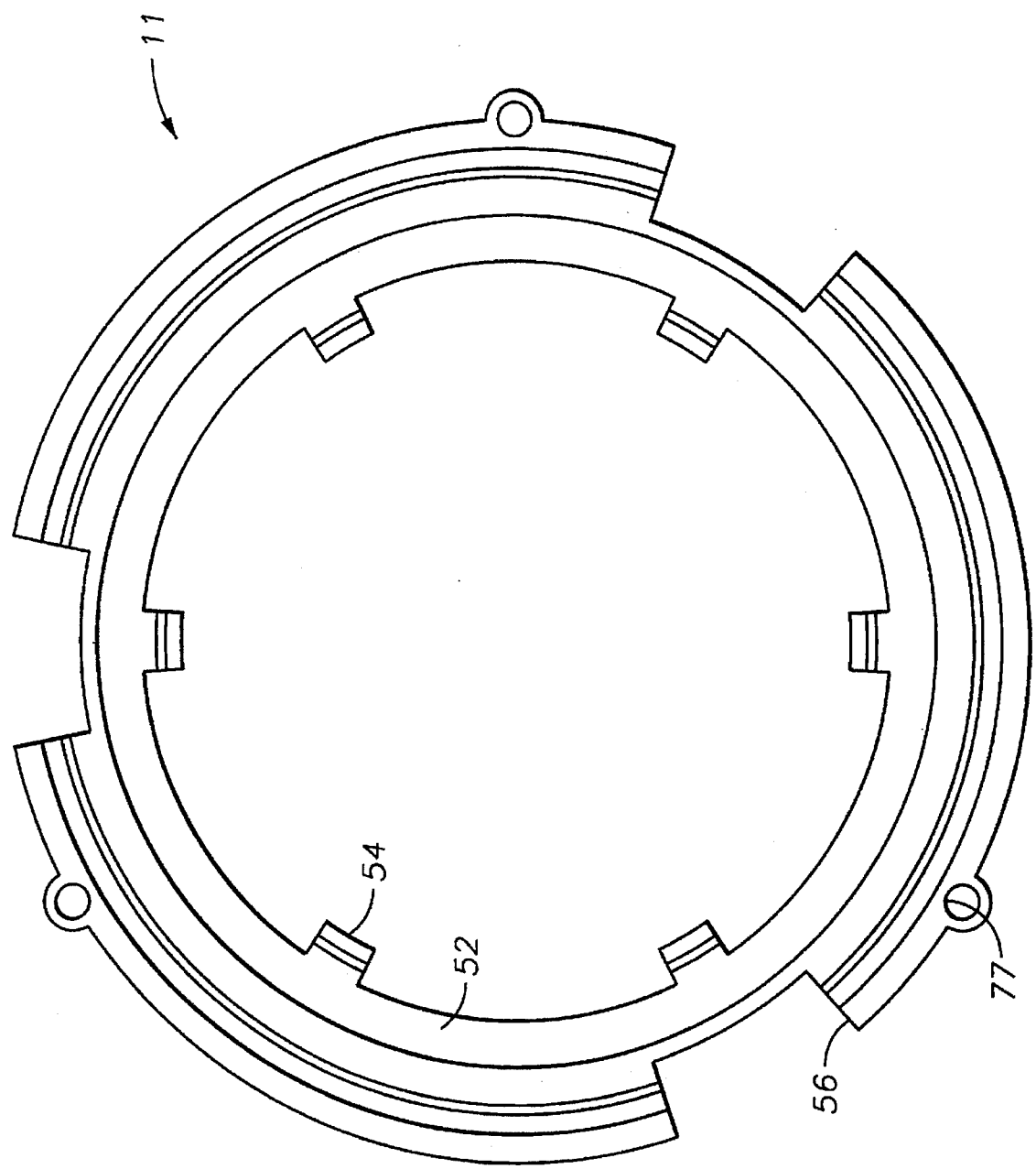
FIG. 4 is a bottom view of the inner ring shown in FIG. 2.

As shown in FIG. 4, the outer alignment portion 50 of the inner ring 11 includes a plurality of recesses 56 formed therein through which extend the afore-described base portions 48 (FIG. 3) of the outer ring 12 to enable the base portion 48 to contact the shield 22 prior to the inner ring 11 contacting the shield 22. In addition, the outer alignment portion 50 includes a plurality of alignment recesses 51 through which are received the alignment pins 49 extending downwardly from the outer ring 12 to align the rings 11, 12.

Cooperation of the Inner Ring and the Outer Ring

In the preferred embodiment, the inner ring 11 is disposed below the outer ring 12 (shown in FIG. 13), between the outer ring 12 and the support member 20. To align the rings, and in particular the inner ring 11 to the outer ring 12 and thus to the support member 20, a plurality of pins 49 extend downwardly from the outer ring 12 and are received in recesses 51 in the inner ring 11 to properly align the inner ring 11 and the outer ring 12.

Figure 8:
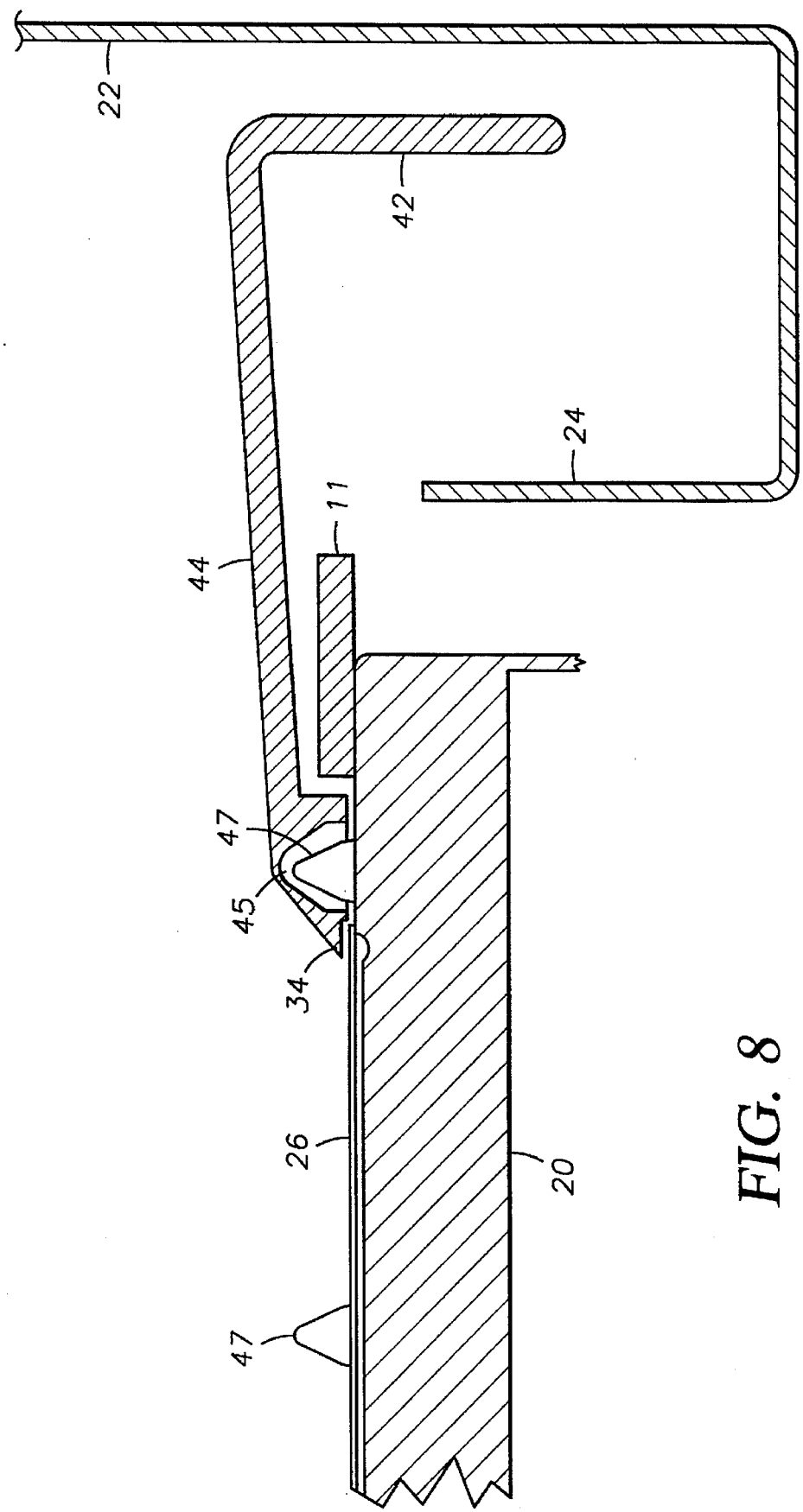
FIG. 8 is a partial sectional view of the interface of the ring assembly, the support member and the substrate with the outer ring received on the substrate, including the alignment pins of the support member and the alignment recesses of the outer ring.

To align the ring assembly over the substrate 26, the support member 20 includes a plurality of tapered pins 47 extending upwardly from the upper surface of the support member 20 about the perimeter of a substrate 26 received on the support member 20, and the outer ring 12 includes a corresponding plurality of alignment recesses 45 therein. (As shown in FIG. 8) When the outer ring 12 is received on the support member 20, the pins 47 are received within the alignment recesses 45, to properly align the outer ring 12, and inner ring 11, over the pedestal 20 and substrate 26 to ensure the desired alignment therebetween.

When the support member 20 is in its retracted position, the inner ring 11 and outer ring 12 rest on the upturned wall 24 of the shield member 22. (as seen in FIG. 5) In this position, a clearance gap 55 is formed between the lower surface 57 of the roof 44 of the outer ring 12 and the upper surface 59 of the inner ring 11. The gap 55 is greater than the distance traveled by the inner ring 11 after the support member 20 contacts the base portion 52 of the inner ring 11, but before the outer ring 12 is contacted by the substrate 26. This spacial difference allows the inner ring 11 to be recessed under the outer ring 12 without contacting the lower surface 57 of the outer ring 12.

As seen in FIG. 2, a gap 61 is formed between the lower face of the support tab 48 of the outer ring 12 and the upper face of the base portion of the inner ring 11 in the processing position. This gap is sufficiently sized to enable the lower face of the ejector tabs 54 to descend below the lower face of the spacers 36 of the outer ring 12 after the outer ring 12 has been repositioned on the shield 22, but before the inner ring 11 is repositioned on the shield 22. Uniquely, the distance traveled by the inner ring 11 between the time the outer ring 12 is repositioned on the shield 22 and the inner ring 11 is repositioned on the shield 22 is sufficient to allow the lower face of the ejector tabs 54 of the inner ring 11, which are spaced during processing from the upper surface of the substrate 26, to descend on the support member 20 below the lower face of the spacers 36 of the outer ring 12 to selectively contact the upper surface of a substrate 26 which has become adhered to the outer ring 12 and break the bond of a bridging film layer 40.

In an alternative embodiment, the separating force exerted by the inner ring 11 on the surface of the substrate 26 is assisted by external biasing members 71 such as springs extending between the outer ring 12 and the inner ring 11. Preferably, as seen in FIG. 25, the springs 71 are mounted on the lower surface of the roof 44 of the outer ring 12 at an attachment portion 73. The spring 71 also includes an engagement portion 75 which engages the upper surface of the inner ring 11 when the rings 11, 12 are lifted off the hanger 22 and a spring arm 77 extending between the attachment portion 73 and the engagement portion 75.

As the support member 20 moves through the hanger 22, the inner ring 11 is first lifted off the hanger 22. As the inner ring 11 is lifted by the support member 20, the upper surface of the inner ring 11 contacts the engagement portion 75 of the springs 71. The springs 71 are compressed by the weight of the outer ring 12 until the outer ring 12 is received on the substrate 26 and subsequently lifted off the hanger 22. The weight of the outer ring 12 must be sufficient to compress the springs 71. Accordingly, springs having spring constants less than the mass of the outer ring 12 must be selected to cooperate with outer rings of determined mass.

If the substrate 26 adheres to the outer ring 12, the springs 71 exert a force on the upper surface of the inner ring 11 to assist the inner ring in pushing the substrate 26 from the outer ring 12 once the outer ring 12 has been repositioned on the hanger 22 and the inner ring 11 continues descending along with the support member 20. The assistance provided by the springs 71 only becomes necessary if the strength of the bridging layers 40, 40a exceeds the weight of the inner ring 11. The force exerted by the springs 71 on the inner ring 11 is preferably perpendicular to the plane of the upper surface of the substrate 26 so that the inner ring 11 exerts an even force on the upper surface of the substrate 26, should a substrate become adhered to the ring assembly, to prevent scratching of the substrate surface.

Operation of the Deposition Chamber and Ring Assembly

After deposition, the support member 20 moves downwardly in the chamber 10 to reposition the outer ring 12 on the upturned inner ledge 24 of the shield 22. The outer ring 12 first engages the ledge 24, and the inner ring 11, supported on the upper edge of the support member 20, continues moving downwardly a small distance, i.e., by the afore-described gap 61 formed between the lower face of the support tab 48 of the outer ring 12 and the upper face of the base portion of the inner ring 11, until the outer annular base portions, or support tabs 50, engage the ledge 24. This small distance is sufficient to allow the ejector tabs 54 of the inner ring 11 to contact, and eject, a substrate 26 from the ring assembly in the event a bridging film layer 40 forms between the outer ring 12 and the substrate 26 before the inner ring 11 is received on the upturned inner ledge 24 of the shield 22. No contact between the inner ring 11 and the substrate 26 occurs unless a substrate 26 has become adhered to the outer ring 12, because the inner ring 11 and substrate 26 will continue moving downwardly together until the inner ring 11 is located on the ledge 24.

By providing a ring 11 to eject the substrate, no arcuate motion of the ejector mechanism is needed to push the substrate 26 from the outer ring 12 and scratching of the substrate 26 will be minimized.

In the most preferred implementation of the invention, the substrate engaging face of the ejector tabs 54 of the inner ring 11 are disposed at a 0° to 5° angle with respect to the inner base portion 52 of the inner ring 11 to prevent chipping or marking of the surface of the substrate 26 during the action of ejecting the substrate 26 from the outer ring 12 when it has become adhered. The angled surface ensures that the contact between the substrate 26 and the inner ring 11 is on the contacting surface 54 and not on the inner diameter of the inner ring.

The length of each contacting portion 54 is critical because it must satisfy two criteria. First, the contacting portion 54 must be sufficiently small so that when the inner ring 11 contacts the support member 20 on ascension of the support member 20 as shown in FIGS. 2 and 7, the inner ring 11 will be pushed inside the cavity defined by the roof 44, the lip 34 and the base 42 of the outer ring 12 without contacting the outer ring 12 or rubbing against the lip 34. Second, the contacting portion 54 must be sufficiently long to extend over the perimeter of the substrate 26 as shown in FIG. 7.

The inner tip, or contacting portion, of each ejector tab 54 also must be positionable over the upper surface of the substrate 26 directly adjacent to the edge of the substrate 26. To ensure that the ejector tabs 54 are so positioned, the support member 20 includes a plurality of tapered pins 47 extending upwardly from the upper surface of the support member 20 about the perimeter of a substrate 26 received on the support member 20, and the outer ring 12 includes a corresponding plurality of alignment recesses 45 therein. (shown in FIG. 8) When the outer ring 12 is received on the support member 20, the pins 47 are received within the alignment recesses 45, to properly align the outer ring 12 over the pedestal 20 and substrate 26 to ensure the desired alignment therebetween. To align the rings, and in particular the inner ring to the outer ring and thus to the support member 20, a plurality of pins 49 extend downwardly from the outer ring 12 and are received in recesses 51 in the inner ring 11 to properly align the inner ring 11 and the outer ring 12.

The contacting portion 54 is preferably angled at 0° to 5° relative to the upper surface of the substrate 26 so that the inner edge of the contacting portion 54 will not contact, and possibly scratch, the substrate 26 if adhesion of the substrate 26 to the outer ring 12 occurs.

Figure 13:
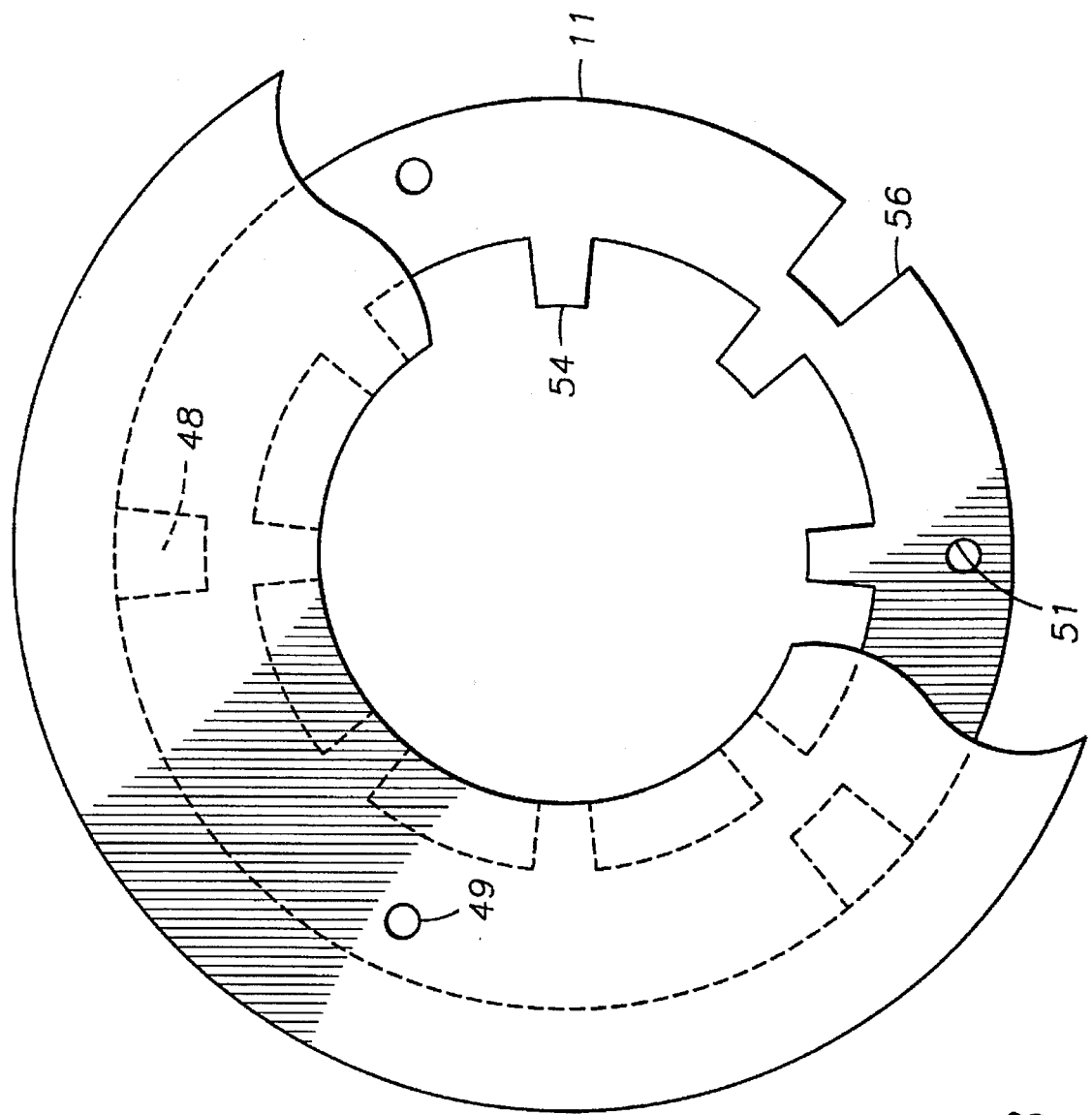
FIG. 13 is a top view of the ring assembly depicting the relationship of the inner ring and outer ring, the outer ring being partially cut away.

In the free condition of the inner ring 11, as shown in FIG. 6, the planar surface of the contacting portion 54 is disposed parallel to the mounting recesses 46. Thus, the planar surface of the contacting portion 54 is disposed above and adjacent the outer edge of the upper surface of the substrate 26, preferably parallel (or at a small angle <5°) to the top-most surface of the substrate 26 so that if the contacting portion 54 engages the substrate 26, as shown in FIG. 13, scratching of the substrate will not occur.

In operation, before a new substrate is carried into the deposition chamber 10, a lift mechanism 60 lowers the support member 20 below the upturned wall 24 as described earlier. A robot places the substrate 26 above the caps 30 and pins 30a extending above the top surface of the support member 20, and the pin platform 28 moves upwardly to move the caps 30 and pins 30a upwardly to lift the substrate 26 off the robot blade. Then, after the robot blade retracts, the lift mechanism 60 raises the support member 20 so that the pins retract and the substrate 26 is carried upward while resting on the top surface of the support member 20. FIGS. 6 and 8 show the apparatus at this point in time, just before the support member ascends to contact the inner base portion 52 of the inner ring 11 and the substrate 26 contacts the spacers 36 of the outer ring 12.

As the lift mechanism 60 continues raising the support member 20, the inner ring 11 is lifted off the upturned lip 24 supported on the support member 20 by the inner base portion 52, until a portion of the surface on the top of the substrate 26, near its perimeter, contacts the spacers 36 of the outer ring 12. As the support member 20 continues ascending, the substrate 26 supports the entire weight of the outer ring 12 and lifts it above the upturned wall 24. At this point, the inner ring 11 is supported by its base portion 52 on the support member 20 and the outer ring 12 is supported by its spacers 36 on the substrate 26 such that no contact exists between the inner ring 11 and the outer ring 12. At this point, the positions of the described components are as shown in FIGS. 1 and 2. The lift mechanism stops raising the support member 20 when the substrate 26 reaches the desired position near the sputtering target 18, or other deposition source, in order for the film deposition process to begin.

In the deposition process, target material sputtered from the target 18 (or provided by other deposition processes) deposits on the substrate 26, and the roof 44 of the outer ring 12 substantially shields the perimeter of the substrate 26 and the inner circumferential face 58 and the underside 56 of the outer ring 12 from deposition material. However, material will also be deposited on the roof 44 and overhanging lip 34 of the outer ring 12. The resulting layer of material accumulates over many deposition cycles, i.e. as substrates are sequentially processed through the chamber 10, thus increasing in thickness as the substrates are sequentially processed in the deposition chamber 10. The layer 40 and 40a can grow thick enough to bridge the gap between the overhanging lip 34 of the outer ring 12 and the substrate 26 as shown in FIG. 2, and this bridging layer 40 and 40a can act as an adhesive which bonds the substrate 26 to the lip 34 of the outer ring 12.

After the deposition of a film on the substrate 26 is completed, the lift mechanism 60 lowers the substrate support member 20. The substrate 26 and the rings 11, 12 descend along with the support member 20 until the base portion 48 of outer ring 12, which extends below the inner ring 11 and into a recess 56 provided therefore, comes to rest on the upturned ledge 24 of the shield 22. At this point, the outer ring 12 cannot descend any further, while the support member 20 continues to descend. The inner ring 11, supported on the support member 20, continues to descend a short distance until the outer alignment or base portion 50 thereof engages the upturned wall 24 of the shield 22. Note that if the substrate is not adhered or bonded to the outer ring 12, the substrate 26 will continue to descend with the support member 20 as the support member 20 continues to descend and the ejector tabs 54 do not contact the substrate. However, in the event the substrate 26 has become adhered to the outer ring 12, the contacting portion of the ejector tabs 54 of the inner ring 11 will contact the outer edge of the substrate 26 and eject the substrate 26 from the ring assembly.

In our invention, the adhesive or bonding strength of the layer 40 and 40a of bridging material must be overcome by the weight of the inner ring 11 as it engages the edge of the substrate. The weight of the inner ring 11 should be configured for each substrate size and potential bridging layer material to accomplish ejection of the substrate following formation of a bridging layer. Because the inner ring 11 continues to descend following the positioning of the outer ring 12 on the upturned wall 24, the contacting portion 54 exerts a downward force on the substrate 26 equal to the weight of the inner ring 11 if the substrate 26 is adhered to the outer ring 12, the force tending to separate the substrate 26 from the outer ring 12. Preferably, the inner ring 11 provides a total force of about 0.25 to 2.0 pounds as it is received on the substrate edge. In general, the inner ring 11 should be weighted to provide a total force sufficient to overcome the adhesive strength of the bridging layer 40 and 40a formed of deposition material. Preferably, the rings are composed of SST, titanium, quartz or another thermally stable or even electrically insulating material, which is stable in a plasma or CVD environment.

The inner ring 11 ensures the separation of the substrate 26 from the outer ring 12 with minimal particle generation, and with a continuously reproducible load force. The elimination of moving parts substantially reduces the risk of substrate damage resulting from particle generation or arcuate or linear scratching forces applied to the edge of the substrate while accomplishing both clamping and ejection. The only contact between the inner ring 11 and the outer ring 12 may occur at the alignment pins 49, which is minimal as the contact region between these elements is substantially line contact between the pins 49 and the recesses 51. Therefore, there is minimal opportunity for particle generating contact between the inner ring 11 and the adjacent surfaces of the outer ring 12. Likewise, because there are no moving portions connecting the inner ring 11 and the outer ring 12, the inner ring 11 will move between a heater pick up position and a processing position without binding on adjacent surfaces of the outer ring 12, while the position of the contacting portion of the ejector tabs 54 in the free state is reproduced during each engagement and disengagement of the rings with the substrate 26. Likewise, the inner ring 11 is protected from the deposition environment by the roof 44.

Although the invention has been described wherein the rings function as a clamp ring, it is equally suited for incorporation into cover rings, which shield the substrate edge but do not provide the force used to clamp the substrate to the support member.

Alternative Embodiments

Figure 9:
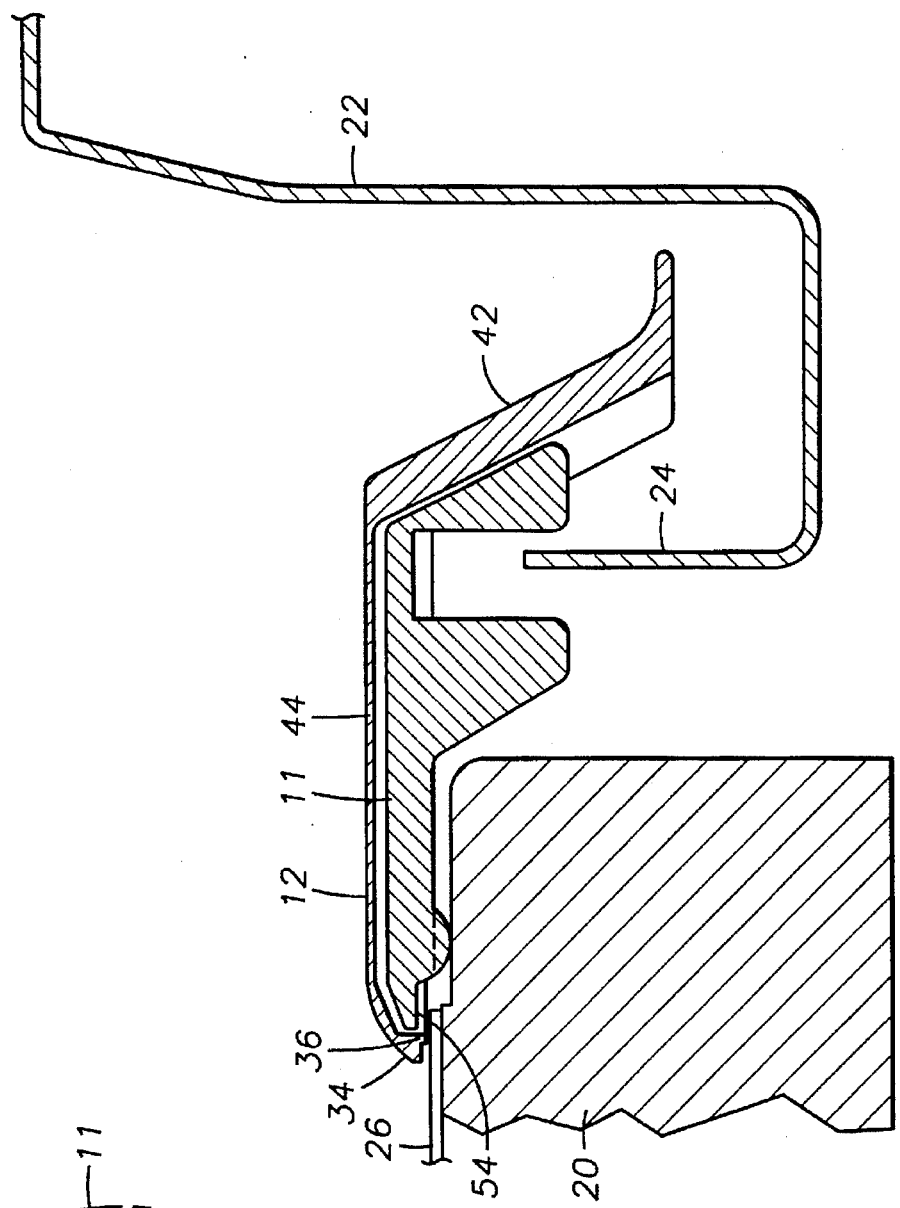
FIG. 9 is a partial sectional view of an alternative embodiment of the present invention depicting the interface of the ring assembly, the support member and the substrate with the outer ring received on the substrate.
Figure 10:
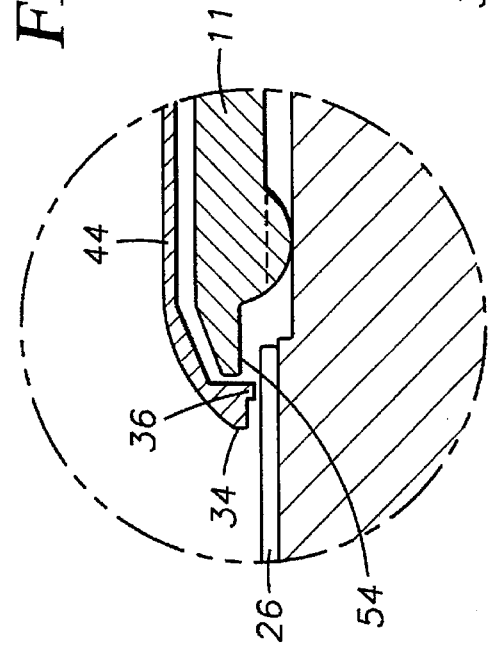
FIG. 10 is an enlarged view of an alternative embodiment of the present invention depicting the positioning of the ring assembly on the substrate and support member.

FIGS. 9–12 describe alternative embodiments of the present invention. Referring to FIG. 9, the ring assembly includes the inner ring 11 and the outer ring 12. The base 42 of the outer ring 12 extends downwardly at an angle relative to the plane of the roof 44. The inner ring 11 includes a support slot 61 defined in its bottom face which is adapted to receive the upturned wall 24 of the hanger 22. A domed protrusion 62 supports the inner ring on the pedestal following ascension of the pedestal during processing. The ring assembly shown in FIGS. 9–12 operates essentially as the embodiments described above.

We claim:

1. A semiconductor substrate deposition chamber, comprising;

an enclosure;

a support member positionable within the enclosure for supporting a substrate in the chamber;

a hanger positioned within the chamber;

a first ring positionable on said hanger and including a base adapted to be received on the exposed surface of the substrate when received on the support member; and a second ring positionable on said hanger and further positionable to overhang an annular region adjacent to the perimeter of the substrate.

2. The chamber of claim 1, wherein said second ring is at least partially disposed intermediate said first ring and said support member.

3. The chamber of claim 2, wherein said first ring includes at least one support tab to support said first ring on said hanger.

4. The chamber of claim 3, wherein said second ring includes a plurality of slots extending radially inwardly from the perimeter thereof, and said support tabs of said first ring extend therethrough.

5. The chamber of claim 4, wherein said first ring includes at least one alignment pin extending therefrom, and said second ring includes at least one alignment recess therein, said alignment pin receivable in said alignment recess to align said first and second rings during processing.

6. The chamber of claim 5, wherein said base adapted to be received on the exposed surface of the substrate comprises a plurality of spacers.

7. The chamber of claim 1 further including a biasing member.

8. The chamber of claim 7, wherein said biasing member includes at least one spring interdisposed between said rings.

9. The chamber of claim 8, wherein said spring is attached to said first ring.

10. The chamber of claim 9, wherein said spring includes an attachment portion attached to a roof of said first ring, an engagement portion engaged against the upper surface of the second ring when said rings are lifted off said hanger, and a spring arm extending between said attachment portion and said engagement portion.

11. An apparatus for shielding the edge of a semiconductor substrate from a deposition environment maintainable within a chamber, comprising:

a first annular member positionable on said substrate to overhang the edge of a substrate received on said support member; and a second annular member translatably positioned adjacent the first annular member to ensure separation of the substrate from the first annular member after the formation of a deposition layer on the substrate, said second annular member positionable in a first, shield supported position and a second, substrate support member supported position.

12. The apparatus of claim 11, wherein said first annular member comprises a clamp ring having a lip overhanging the upper surface of the substrate when received on said support member.

13. The apparatus of claim 12, wherein said second annular member comprises a biasing ring.

14. The apparatus of claim 13, wherein said biasing ring is disposed between said clamp ring and said support member.

15. The apparatus of claim 14, wherein said biasing ring includes a tab overhanging an annular region adjacent to the perimeter of the substrate.

16. The apparatus of claim 15, wherein said clamp ring includes at least one alignment pin, and said biasing ring includes at least one alignment recess, said alignment pin receivable in said alignment recess to align said clamp ring and said biasing ring.

17. The apparatus of claim 16, wherein said biasing ring includes an outer base portion adapted to be received on a hanger positioned within the chamber.

18. The apparatus of claim 17, wherein said biasing ring is supportable on said hanger and a substrate support member.

19. The apparatus of claim 18, wherein said clamp ring is supportable on said hanger and a substrate.

20. The apparatus of claim 11, wherein said second annular member includes a biasing ring and at least one spring interdisposed between said biasing ring and said clamp ring.

21. The apparatus of claim 20, wherein said spring is attached to a roof of said annular member and extends between said roof and said biasing ring.

22. A method of ensuring the separation of a substrate from a shielding member, comprising:

extending a portion of an annular member over the edge of a substrate;

exposing the substrate and annular member to a deposition environment;

providing an annular biasing member; and pushing the substrate from the shield member with the annular biasing member in the event an adhering film layer has formed between the substrate and the annular member.

23. The method of claim 22, wherein said annular member is a first ring and said annular biasing member is a second ring.

24. The method of claim 23, wherein said second ring includes an engagement portion engageable against the exposed surface of the substrate only when an adhering layer has formed between the second ring and the substrate.

25. The method of claim 24, wherein said first ring includes a plurality of spacer members received on said substrate during processing, said spacer members having a slot through which said engagement portions of said inner ring extend to overhang an annular region adjacent the edge of the substrate.

26. The method of claim 23, wherein said annular biasing member includes an engagement arm extending between the annular member and the biasing member.

27. The method of claim 23, including the further steps of:

spacing the engagement portion of the second ring from the surface of the substrate when the substrate is exposed to the deposition environment; and contacting the engagement portion with the substrate only when a film layer has formed between the substrate and the first ring.

28. The method of claim 23, further including the steps of:

providing a moveable support member in the chamber;

positioning the first and second rings in the chamber on a hanger;

positioning the support member below the hanger and placing a substrate thereon;

moving the support member, with the substrate thereon, through the hanger to first position the second ring on the support member and then to position the first ring on the substrate;

exposing the substrate to the deposition environment with the second ring positioned on the support member and the first ring positioned on the substrate; and withdrawing the support member through the hanger to first position the first ring on the hanger and then to position the second ring on the hanger.

29. The method of claim 28, wherein said first ring and said second ring are spaced to define a gap therebetween when said first and second rings are supported on the hanger.

30. The method of claim 29, wherein said second ring is moves through said gap on elevation of the support member to narrow the gap between the first and second rings until the first ring is received on the substrate.

31. The method of claim 28, wherein an engagement portion of said second ring is extendable below an engagement portion of said first ring to contact the upper surface of a substrate when said support member is withdrawn through the hanger only when an adhering layer has formed between the rings and the substrate.

32. An apparatus for shielding the edge of a substrate from film layer deposition materials in a processing chamber, comprising;

a shield ring having a roof and an inner lip; and a biasing ring disposed below said shield ring, said biasing ring having a substrate ejecting portion.

33. The apparatus of claim 32, wherein said shield ring includes a base portion extending from said roof; and said biasing ring includes an inner annular base portion.

34. The apparatus of claim 33 further comprising at least one spring member.

35. The apparatus of claim 33, wherein said lip includes a recess therein; and said inner ring is received in said recess when the substrate is exposed to the deposition environment.

36. The apparatus of claim 35, wherein said shield ring further includes a plurality of spacers extending from said roof.

37. The apparatus of claim 36, wherein said spacers define a slot wherein an engagement portion of said inner ring is received.

38. The chamber of claim 37, wherein said first ring and said second ring are spaced to define a gap therebetween.

39. The chamber of claim 38, wherein said second ring is positionable within the gap formed between the first and second rings as the support member ascends above the hanger.

40. The apparatus of claim 11, wherein said second annular member is disposed below said first annular member, and said second annular member and first said annular member are spaced to define a gap therebetween.

41. The apparatus of claim 33, wherein said roof and said base portion of said first ring define a gap therebetween, said biasing member positionable within said gap to move between a hanger supported position and a support member supported position.

42. The apparatus of claim 32, further comprising a hanger positioned in the chamber and supporting said shield ring and said biasing ring thereon.

43. The apparatus of claim 42, further comprising a substrate support member positionable at a retracted position in the chamber for receipt of a substrate thereon, a first engagement position for the engagement of the substrate support member against the biasing member, a second engagement position for the engagement of the substrate support member against the shield ring suspended on said hanger, and a third, extended position wherein the substrate support member is moved through the biasing ring and the shield ring and lifts said biasing ring and said shielding ring from said hanger.

* * * * *